(12) United States Patent
Munetoh et al.

(10) Patent No.: US 10,937,484 B2
(45) Date of Patent: Mar. 2, 2021

(54) DYNAMIC BANDWIDTH THROTTLING OF DRAM ACCESSES FOR MEMORY TRACING

(71) Applicant: INTERNATIONAL BUSINESS MACHINES CORPORATION, Armonk, NY (US)

(72) Inventors: Seiji Munetoh, Tokyo (JP); Nobuyuki Ohba, Miyagi-ken (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 133 days.

(21) Appl. No.: 14/984,319

(22) Filed: Dec. 30, 2015

(65) Prior Publication Data

US 2017/0192697 A1 Jul. 6, 2017

(51) Int. Cl.
*G11C 11/406* (2006.01)
*G06F 5/12* (2006.01)

(52) U.S. Cl.
CPC .............. *G11C 11/406* (2013.01); *G06F 5/12* (2013.01); *G11C 2211/4061* (2013.01)

(58) Field of Classification Search
CPC .... G06F 3/0619; G06F 3/0634; G06F 3/0653; G06F 3/0656; G06F 3/0673; G06F 5/10; G06F 5/12; G11C 11/40607; G11C 11/406; G11C 11/40611; G11C 11/40615; G11C 29/783; G11C 2211/401; G11C 2211/4061
See application file for complete search history.

(56) References Cited

U.S. PATENT DOCUMENTS

| | | | | |
|---|---|---|---|---|
| 5,072,420 A | * | 12/1991 | Conley | G06F 13/1673 710/54 |
| 5,767,866 A | * | 6/1998 | Chee | G06F 3/1431 345/535 |
| 6,119,207 A | * | 9/2000 | Chee | G06F 5/12 710/40 |
| 6,172,927 B1 | * | 1/2001 | Taylor | G06F 5/10 345/537 |
| 6,396,894 B2 | * | 5/2002 | Cao | G11C 19/28 365/221 |
| 6,732,307 B1 | * | 5/2004 | Edwards | G06F 11/3636 714/45 |

(Continued)

OTHER PUBLICATIONS

A screen shot showing the definition of "trace" per the Cambridge Dictiontaken on Sep. 6, 2015 by archive.org of the web page https://dictionary.cambridge.org/us/dictionary/english/trace (Year: 2015).*

(Continued)

*Primary Examiner* — Mano Padmanabhan
*Assistant Examiner* — Janice M. Girouard
(74) *Attorney, Agent, or Firm* — Tutunjian & Bitetto, P.C.; Randall Bluestone

(57) ABSTRACT

A system and method of avoiding loss of memory trace data, including monitoring a first-in-first-out (FIFO) buffer to determine if the FIFO buffer has overflowed due to memory access, determining whether an overflow of the FIFO buffer is acceptable, changing an operating mode of a target system if overflow of the FIFO buffer is unacceptable to avoid FIFO buffer overflow, and collecting memory trace data on the memory accesses.

18 Claims, 4 Drawing Sheets

(56) References Cited

U.S. PATENT DOCUMENTS

| | | | | |
|---|---|---|---|---|
| 7,043,668 B1* | 5/2006 | Treue | ............... | G06F 11/3636 712/227 |
| 7,055,070 B1* | 5/2006 | Uhler | ............... | G06F 11/3636 714/25 |
| 7,231,551 B1* | 6/2007 | Treue | ............... | G06F 11/3636 714/30 |
| 8,612,650 B1* | 12/2013 | Carrie | ............... | G11B 20/10527 710/52 |
| 2005/0120337 A1* | 6/2005 | Serrano | ............... | G06F 11/28 717/127 |
| 2006/0085616 A1* | 4/2006 | Zeighami | ............... | G06F 13/1689 711/167 |
| 2006/0190210 A1* | 8/2006 | Mukherjee | ............... | G01K 1/026 702/130 |
| 2011/0302445 A1* | 12/2011 | Byom | ............... | G06F 12/123 714/6.1 |
| 2013/0007357 A1* | 1/2013 | Isaac | ............... | G11C 11/40615 711/106 |
| 2014/0241094 A1* | 8/2014 | Bains | ............... | G11C 11/40611 365/222 |
| 2015/0254157 A1* | 9/2015 | Peck | ............... | G06F 11/3476 714/45 |

OTHER PUBLICATIONS

A screen shot of an article from computerhope to explain computer jargan, in this case the term 'trace' https://www.computerhope.com/jargon/t/trace.htm (Year: 2017).*

An archive.org screen shot showning the ftp command referenced in computerhope includes a tracing option per the linux man page at http://linux.die.net/man/1/ftp (Year: 2008).*

A web article titled "What is the difference between DRAM, SRAM, and SDRAM?." that notes that DRAM is the least expensive kind of RAM, and is found in most computers. (Year: 2016).*

* cited by examiner

DYNAMIC BANDWIDTH THROTTLING OF DRAM ACCESSES FOR MEMORY TRACING

BACKGROUND

Technical Field

The present invention relates to controlling a bandwidth of input data compared to the bandwidth of a storage system, and more particularly to throttling the DRAM access bandwidth.

Description of the Related Art

Memory trace operations follow the read and write operations to storage locations of a random access memory (RAM), and log the type of operation and memory address being accessed. In a memory tracer system, a memory trace operation stops when the internal first-in first-out (FIFO) buffer overflows. An overflow can occur when a central processing unit (CPU) or memory controller (MC) sends memory access instructions faster than the memory can process the instructions. A FIFO buffer can overflow at different points depending on the type and speed of memory being accessed.

RAM and in particular dynamic random-access memory (DRAM) has operating limitations that can create a situation in which a computer memory cannot keep up with a CPU that is running at a faster speed. This has been referred to as a memory wall, where input-output (I/O) operations have not kept pace with the millions of instructions per second (MIPS) of the CPUs. DRAM memory cells typically include a single transistor and a capacitor that stores a charge in contrast to static random-access memory (SRAM) cells which typically include several transistors. A memory cell is typically the smallest addressable memory unit. Static random-access memory (SRAM) is usually used on or adjacent to the CPU and operates at a speed comparable to the CPU, whereas DRAM may be accessed over a bus. Both SRAM and DRAM are considered volatile memory because their contents is lost when power is removed from the cell.

SUMMARY

An aspect of the disclosure relates to a method of avoiding loss of memory trace data including monitoring a first-in-first-out (FIFO) buffer to determine if the FIFO buffer has overflowed due to memory access, determining whether an overflow of the FIFO buffer is acceptable, changing an operating mode of a target system if overflow of the FIFO buffer is unacceptable to avoid FIFO buffer overflow, and collecting memory trace data on the memory accesses.

An aspect of the disclosure relates to a non-transitory computer readable storage medium including a computer readable program for avoiding loss of memory trace data, wherein the computer readable program when executed on a computer causes the computer to perform the steps of monitoring a first-in-first-out (FIFO) buffer to determine if the FIFO buffer has overflowed due to memory access, determining whether an overflow of the FIFO buffer is acceptable, changing an operating mode of a target system if overflow of the FIFO buffer is unacceptable to avoid FIFO buffer overflow, and collecting memory trace data on the memory access.

An aspect of the disclosure also relates to a target system configured to avoid loss of memory trace data including a central processing unit (CPU) configured to execute program instructions including memory access instructions, a storage memory configured for memory access by the target system, and a memory tracer system configured to monitor memory access by the target system, wherein the memory tracer system includes a first-in-first-out (FIFO) buffer coupled to and in electronic communication with the central processing unit and the storage memory, wherein the memory tracer system is configured to monitor the FIFO buffer to determine if the FIFO buffer has overflowed due to memory access, determine whether an overflow of the FIFO buffer is acceptable, change an operating mode of the target system if overflow of the FIFO buffer is unacceptable to avoid FIFO buffer overflow, and collect memory trace data on the memory access.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
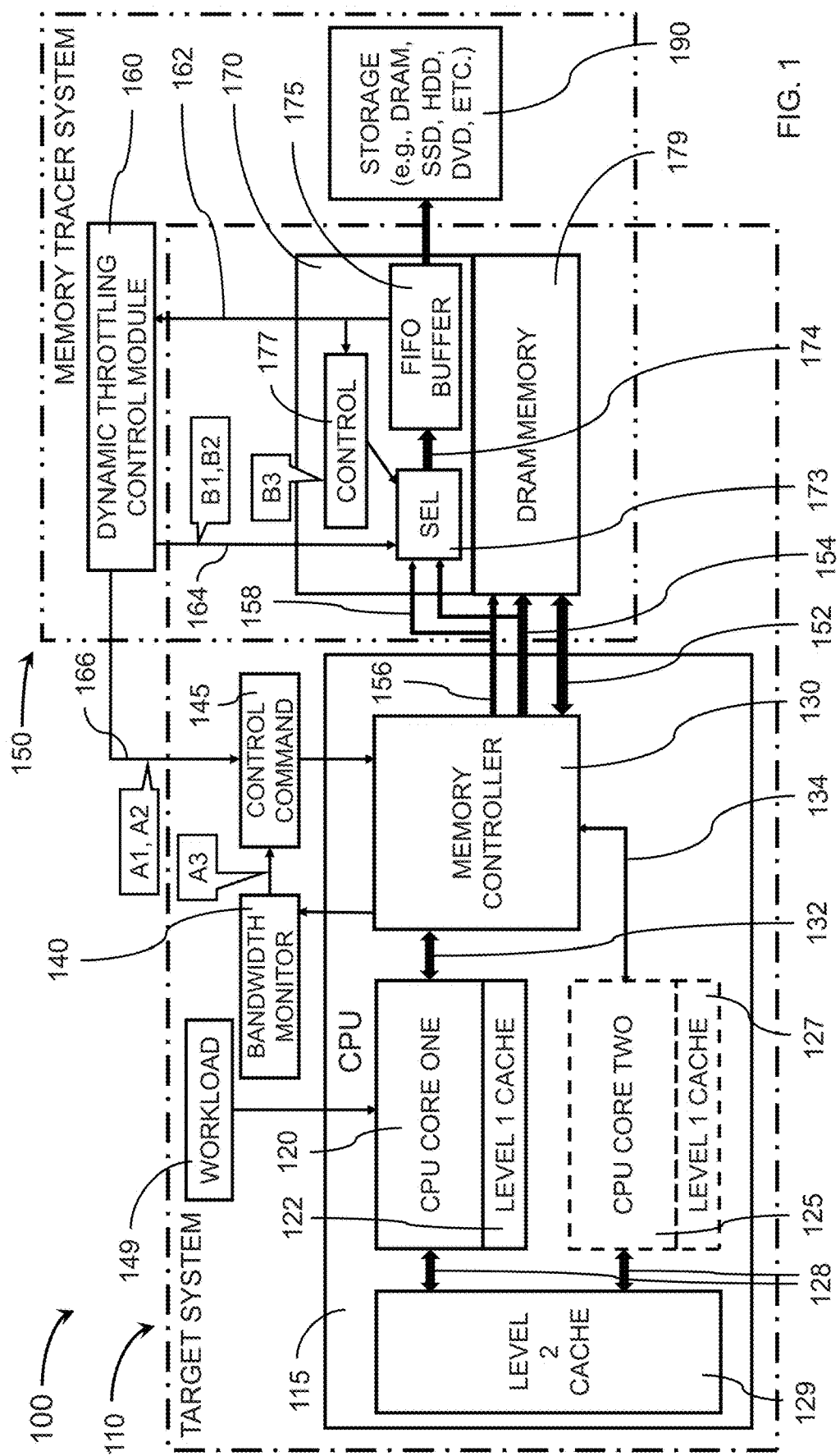
FIG. 1 is a block diagram of a target system and memory tracer system in accordance with an illustrative embodiment.

Principles and embodiments of the present invention relates generally to reducing the band width of the traced data, including the DRAM commands and addressing. DRAM memory modules may be composed of memory cells arranged in rows and columns referred to as banks, where multiple banks can be arranged in a rank. A memory module may have two ranks placed on the chip with one rank mounted on each face of the module. This is typically referred to as dual inline memory modules, or DIMMs. A memory cell can be addressed by reference to the cell's row and column.

DRAM speed/bandwidth can be limited by time costs for particular functions necessary for their operation, such as refreshing the memory and latencies due to time delays between initiating a command to memory and its execution. Because the charge on the DRAM memory cell slowly leaks away, the memory cells require a periodic recharge or refresh. The time interval between refreshes of a memory cell is typically less than the time period for the charge level of a "1" value to decrease to a level that cannot be distinguished from a "0" value. Since there are many memory cells in a memory module that require repeated refreshing, the memory module typically has a defined refresh frequency or refresh rate that ensures all memory cells are refreshed before the charge decays. The refresh, however, takes time to execute, requires a command, and the memory cells being refreshed are not available for other operations during that time. Refreshing can therefore interfere with the CPUs access to values stored in memory. Performing the recharge operation has a time cost during which the portion of the DRAM memory being refreshed cannot perform I/O operations. The lag time between when a memory access operation tells the memory module to access a particular memory row and column on a RAM module and the moment when the data from the given memory address is available on the module's output pins is referred to Common Access Strobe (CAS) latency, which limits the number of memory access operations in a given time period. For example, in a synchronous DRAM (SDRAM) there can be a set-up time between a clock trigger and when the memory address is available to be read, and another set-up time between a clock trigger and when a data value is available to be read. Making adjustments for these latencies and time costs can improve the speed of memory I/O operations and reduce the discrepancy between the CPU speed and the memory speed. For example, controlling the refresh command interval to occur faster (e.g., from 3.9 μs to 1.5 μs) can reduce the time that the portion of the DRAM memory being refreshed cannot perform I/O operations. It has been found that FIFO overflow ceases to occur when the refresh command interval is less than 1.95 μs.

The overflow is caused by the excessive bandwidth of input data compared with the write bandwidth of storage system. The refresh commands take up command bandwidth displacing other operation commands.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

In various embodiments, overflow behavior may be determined by the probabilistic properties (average and variance of the arrival and processing time) of the input (traced DRAM command and address) and output (solid state drive (SSD) sequential write) systems.

In various embodiments, a first-in-first-out (FIFO) buffer may be a fixed size buffer, where the size may be determined by the address size, the parallelism of the memory module (e.g., the number of parallel memory banks in a memory module), and the number of memory addresses and/or access commands intended to be buffered. The number of memory addresses and/or access commands intended to be buffered can determine the fixed size of the queue and predetermined size (i.e., length) of the buffer. In various embodiments, the FIFO buffer may be a circular buffer or a linear buffer. The FIFO buffer may be configured to at least temporarily store one or more memory addresses.

Referring now to the drawings in which like numerals represent the same or similar elements and initially to FIG. 1, which illustrates a block diagram of a target system and memory tracer system in accordance with an illustrative embodiment.

A computer system 100 may include a target system 110 and a memory tracer system 150, where the memory tracer system 150 may be configured to monitor memory access by the target system 110. In various embodiments, a target system 110 includes a central processing system (CPU) 115, which may also be referred to as a processor, and a memory tracer system 150. In various embodiments, a memory tracer system 150 may include the memory tracer system controller 170, a dynamic throttling control module 160, and storage memory 190. The memory tracer system controller 170 may be configured to monitor the operation of the CPU 115 and the workload 149 being handled by the CPU. The workload 149 may include program instructions being executed by the CPU 115, which may include memory access instructions. In various embodiments, the memory tracer system 150 is independent of target system 110, such that the target system 110 is unconcerned with FIFO buffer 175 overflow of the memory tracer system 150.

In various embodiments, the memory tracer system controller 170 may include a first-in-first-out (FIFO) buffer 175 coupled to and in electronic communication with the central processing unit 115 and the storage memory 190. A selector 173 may be coupled between the FIFO buffer 175 and a memory controller 130. The FIFO buffer 175 may receive memory access commands and addresses passed through the selector 173. DRAM memory 179 may be coupled to and in electronic communication with the memory controller 130 over a command line 156, an address line 154, and a data line 152.

A computer program typically requires read and write access to memory to function. Values stored in a memory location may be fetched for a computation by the CPU, or a value in a CPU register may be stored back into a memory location, where a memory location may be identified by an address. Typical programs may involve 15 to 40 percent of the instructions accessing memory, where a portion of the instructions may access cache memory and a portion of the instructions may access DRAM memory. After a CPU issues a request to memory, there can be a delay of multiple CPU cycles before a value is retrieved for execution. The memory access command and memory address may be stored in a FIFO buffer. When the number of memory access operations exceeds the I/O speed of the memory, the FIFO buffer can overflow. If a memory value is need to execute an instruction, the CPU may be delayed while it waits for access and execution of the memory operation.

Memory for the computer system 100 may include volatile dynamic random access memory 179, and longer term storage including solid state drives (SSDs), hard disk drives (HDD), optical drives (CD, DVD, Bluray) 190. The DRAM 179 may include one or more memory modules arranged as DIMM. In various embodiments, the memory tracer system 150 may be incorporated into one or more memory module(s) to provide tracing capability of the memory accesses, where the memory tracer system 150 monitors the memory bus for the memory addresses and command signals to the DRAM module.

In one or more embodiments, a CPU 115 may include at least one CPU core 120 (also referred to as a processing core), optionally one or more additional CPU cores 125, and a memory controller 130, which may be an integrated memory controller (IMC) on the same chip as CPU core 120. The CPU core(s) 120, 125 may include level 1 cache memory 122, 127 directly associated with CPU core one 120, and CPU core two 125 respectively. CPU core(s) 120, 125 may include processor registers and arithmetic logic units as would be known in the art in addition to the level 1 cache memory 122, 127. In various embodiments, the CPU 115 may include level 2 cache memory 129 associated with CPU core one 120 over an internal memory bus 128. In various embodiments, the additional CPU core(s) 125 are also associated with level 2 cache memory 129 over an internal memory bus 128. The level 1 cache memory 122, 127 may operate at the same clock speed as the associated CPU core 120, 125, as would be known in the art.

Highly used memory values may be stored in cache memory 122, 127 on the CPU chip, which may be SRAM. The CPU core 120, 125 may then access the cache memory address at speeds comparable with the CPU speed. However, since all values cannot be stored in cache memory because of cost and size limitations, there can be occasions when a needed value is not presently stored in the cache, which results in a cache miss. A memory controller may then look to DRAM 179 or storage 190 for the value. The higher the number of cache misses, the larger the number of DRAM and storage access instructions resulting in a higher likelihood of a FIFO buffer overflow.

In various embodiments, the CPU 115 includes a memory controller 130 that is configured to handle memory access operations involving memory access commands, for example reads (RD), writes (WR), active (ACT), and pre-charge (PRE), where the memory access commands may be communicated to a memory tracer system 150 over a command line 156 and address line 154 of a memory bus. In various embodiments, a memory tracer system 150 may be a special DRAM module that is configured to have a memory tracing feature.

A memory controller 130 may also be configured to issue memory refresh commands, which may be communicated to a memory tracer system 150 over command line 156 and address line 154 of a memory bus. For example, a DRAM can require the charge on the capacitor to be refreshed at regular intervals due to charge leakage.

In various embodiments, the memory controller 130 is connected through a memory bus (also referred to as a channel) having a control line 156, an address line 154, and a data line 152. In various embodiments, the memory bus has a predetermined data bus frequency (e.g., 400 MHz, 533 MHz, 666 MHz, 800 MHz, 1066 MHz, etc.). Data being accessed by read and write commands by the CPU 115 travels over data line 152 and the address of the data travels over address line 154 of the memory bus to the memory tracer system controller 170. The memory tracer system 150 may include a memory tracer system controller 170 that reads the memory bus and recognizes the memory access commands and memory addresses.

In various embodiments, the memory access commands and memory refresh commands may be received by a selector 173. The selector 173 may be configured to accept or discard a received command based on the operation mode of the memory tracer system 150, and instructed by a control module 177 of the memory tracer system controller 170.

In one or more embodiments, the selector 173 may be configured to implement an operation mode (B3) involving dynamically excluding refresh command(s) from the collected memory trace data in response to changes in a FIFO buffer status. The selector 173 may read incoming commands on the command line 156 and determine when a refresh command is not recorded or discarded by the memory tracer system controller 170. By not recording the refresh command, bandwidth can be freed up.

In various embodiments, the selector 173 may be instructed by the dynamic throttling control module 160 to exclude the refresh command(s) from the collected memory trace data all of the time, as indicated by (B1). In various embodiments, the selector 173 may be instructed by the dynamic throttling control module 160 to dynamically exclude refresh command(s) from the collected memory trace data in response to a change in the refresh rates, as indicated by (B2).

In one or more embodiments, dynamic throttling control module 160 may be configured to receive a FIFO buffer signal on FIFO read line 162, and transmit a selection indicator signal over selection line 164. In various embodiments, the dynamic throttling control module 160 continuously monitors the FIFO buffer status, which may include a counter for FIFO overflow event(s), through FIFO read line 162. A FIFO buffer 175 may be monitored to determine the number of data bytes present in the FIFO buffer, where the FIFO buffer 175 sends a signal to the dynamic throttling control module 160 if the FIFO buffer is nearing full capacity (e.g., overflow) or empty (e.g., underflow) indicating usage and/or status. The dynamic throttling control module 160 of the memory tracer system 150 may receive a FIFO buffer signal indicating FIFO buffer overflow on FIFO read line 162, and transmit a selection indicator signal over selection line 164 to selector 173 to exclude refresh commands. The dynamic throttling control module 160 may continuously monitors the FIFO buffer status, and if buffer overflow is detected, the dynamic throttling control module 160 may send a control signal over control line 166 to memory controller 130 to increase the DRAM refresh rate.

In various embodiments, control module 177 may also be configured to receive a FIFO buffer signal indicating FIFO buffer overflow on FIFO read line 162, and transmit a selection signal over a selection line to selector 173.

In one or more embodiments, upon receiving an instruction, selector 173 may exclude incoming refresh command(s) on command line 156 from the collected memory trace data, while retaining other commands received on command line 156 and memory addresses received on address line 154.

In one or more embodiments, dynamic throttling control module 160 may be configured to determine a workload based on FIFO buffer 175 usage and/or status, and transmit a control signal over control line 166 to control command module 145. Dynamic throttling control module 160 may be configured to transmit a refresh rate instruction over control line 166 to control command module 145, which may adjust the refresh rate of the memory controller 130. In various embodiments, a refresh rate change instruction changing a DRAM refresh rate may be transmitted by dynamic throttling control module 160 in response to a FIFO buffer overflow or status change of FIFO buffer 175. The workload (i.e., a process running on CPU 115) may be unaware of throttling through adjustment of a DRAM refresh rate.

In one or more embodiments, bandwidth monitor 140 may be configured to determine a memory access bandwidth of a workload based on the memory access commands received by memory controller 130 from one or more CPU cores 120, 125. The bandwidth monitor 140 may be configured to know a threshold bandwidth to avoid the FIFO overflow. The threshold bandwidth is estimated and adjusted by the actual tracer system behavior.

In various embodiments, control command module 145 may be configured to receive an instruction signal from dynamic throttling controller module 160 to adjust the refresh rate and transmit a control signal to memory controller 130 to adjust the refresh rate for DRAM memory 179. The DRAM refresh rate may be changed in response to changes in the status of FIFO buffer 175. The refresh rate may be increased to reduce the overflow of FIFO buffer 175.

Figure 2:
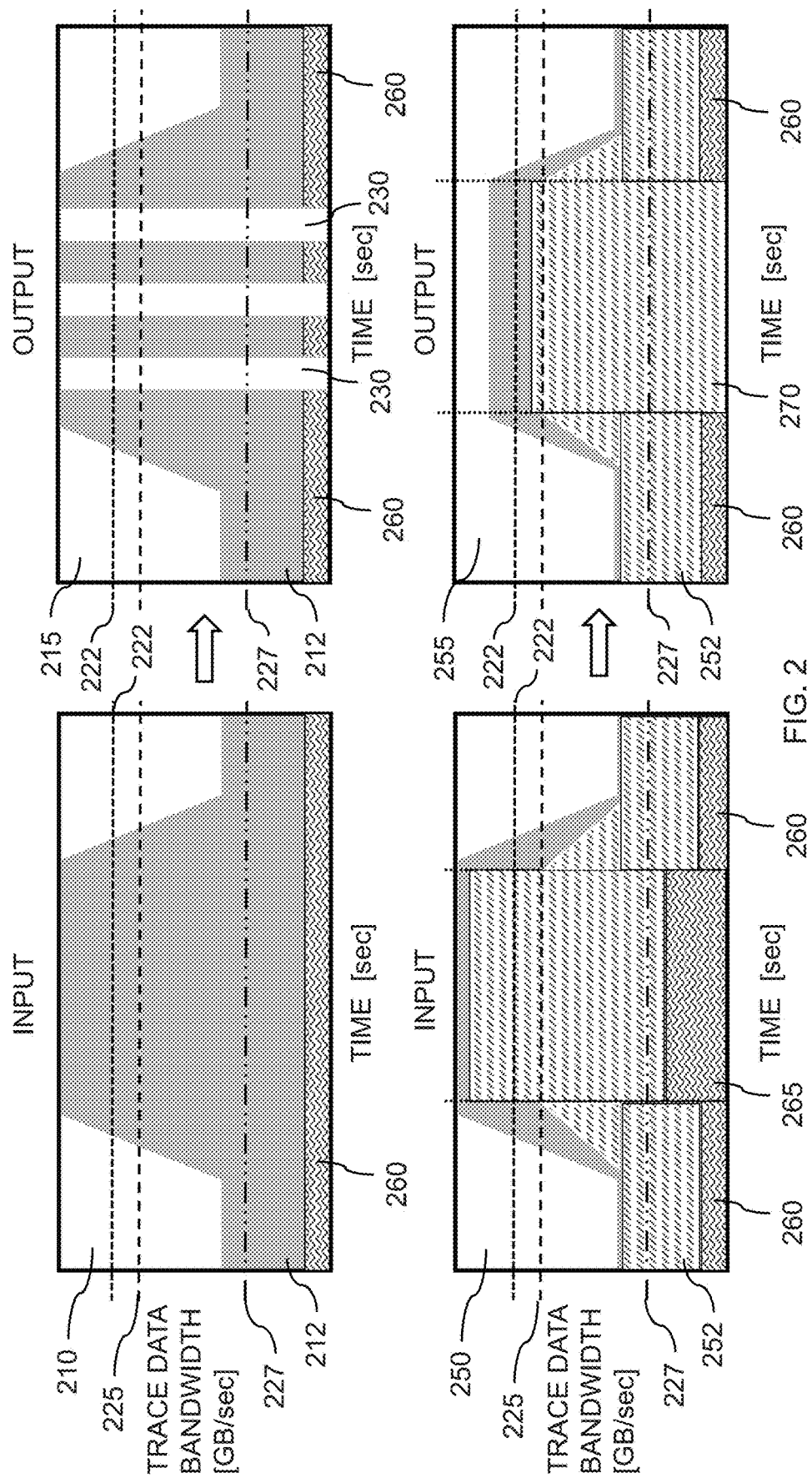
FIG. 2 is a set of graphs showing the effect of dynamic throttling on FIFO buffer overflow in accordance with an illustrative embodiment.

FIG. 2 is a set of graphs showing the effect of dynamic throttling on a FIFO buffer overflow in accordance with an illustrative embodiment.

A comparison of the time sequences of bandwidths is shown in graphs 210, 215, 250, and 255, where graphs 210 and 250 depict input, and graphs 215 and 255 depict output. The y-axis shows a bandwidth in gigabytes per second (GB/sec) in relation to command input, and the x-axis is time in seconds. Line 222 indicates a storage bandwidth, line 225 indicates a threshold bandwidth, and line 227 indicates a maximum refresh bandwidth. Areas 212 and 252 reflect memory access commands (ACT/RD/WR/PRE) received by memory controller 130, as a command ratio. Areas 260 indicate bandwidth taken up by refresh commands, and area 265 indicates an increase in refresh commands for a period of time through dynamic throttling. The collected memory access data is reflected in the output graphs. Graph 215 shows that memory access data is lost 230 during periods of FIFO buffer overflow, where there is no dynamic throttling. In comparison, graphs 250 and 255 illustrate the effect of increased refresh rate with dynamic throttling, where excluding the refresh command from the memory access data in an operation mode, as shown in graph 255, avoids the memory trace access loss shown in graph 215. In various embodiments, taking up bandwidth with refresh commands that are excluded by a selector 173 from memory access data collection provides a reduction in the bandwidth usage and avoids FIFO buffer overflow.

Figure 3:
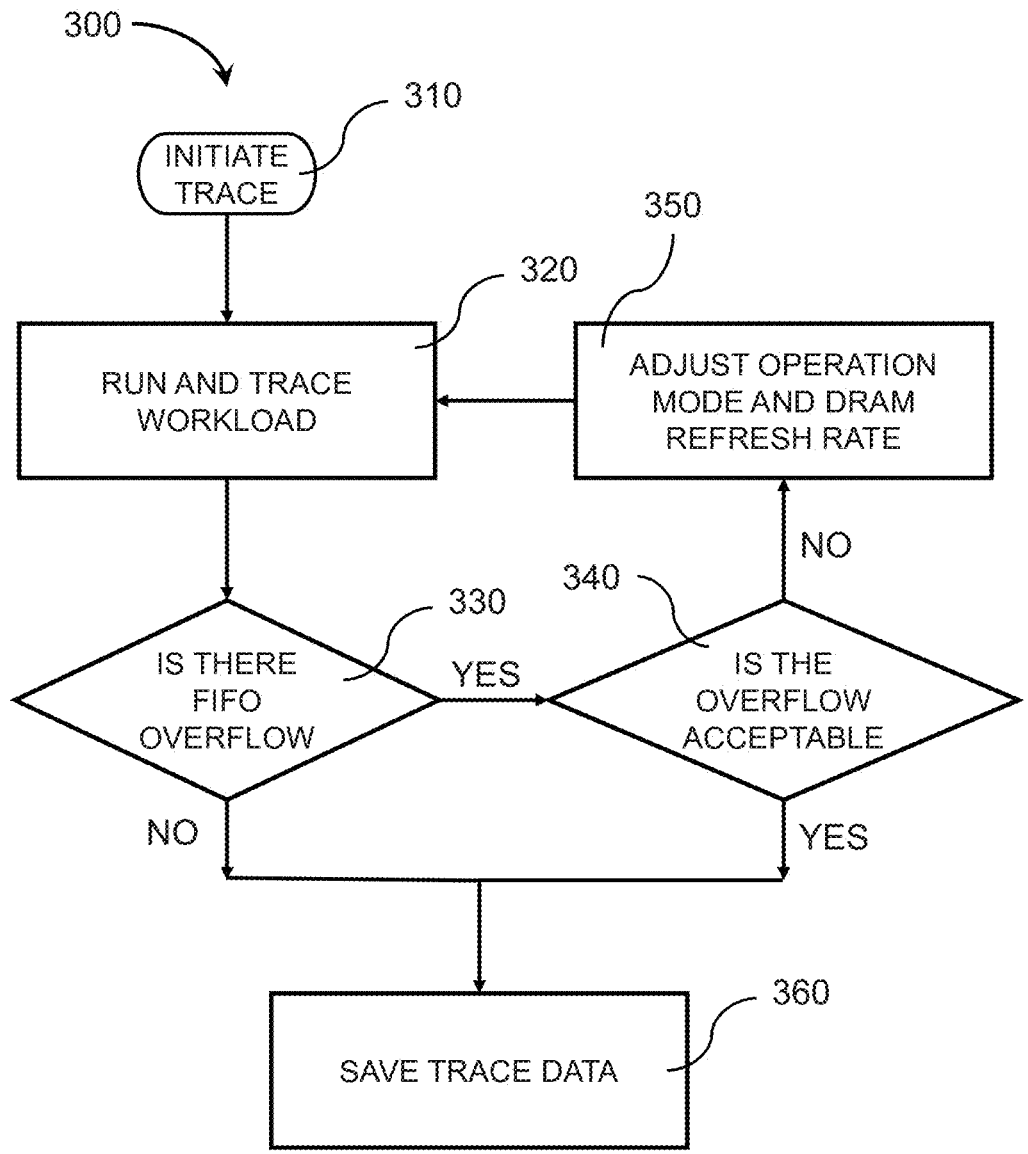
FIG. 3 is a block/flow diagram of a memory trace operation in accordance with an illustrative embodiment.

FIG. 3 is a block/flow diagram of a method in accordance with an illustrative embodiment.

A method 300 relates to monitoring a workload and determining the likelihood of an impending FIFO buffer overflow based on the system's operation mode and refresh rate.

At block 310, a memory trace operation is initiated, where the memory trace may identify the memory addresses of read and write operations. The memory trace data may include the address of memory locations being accessed by a memory controller 130 or CPU 115, and the type of memory access (e.g., read, write, precharge, active), where access can involve read and/or write operations initiated by a computer program generating a workload. The memory trace operation may obtain the type of command from a command line 156, and the address of the memory location being addressed from the address line 154 of a memory bus, where the memory bus may include a command line 156, an address line 154, and a data line 152.

At block 320, the memory tracer system 150 may perform a memory trace to identify the memory addresses being sent on an address line 154 of a memory bus. The memory tracer system 150 may monitor memory access by the target system 110. By reading a sequence of memory addresses from the address line 154 of the memory bus, the tracer system may identify what memory cells are being utilized, and the memory access workload. The rate at which memory access commands are sent in a time period can indicate the workload of the CPU 115 and/or for the DRAM memory 179.

At block 330, the memory tracer system 150 may monitor the FIFO buffer 175 status and determine if the FIFO buffer has overflowed or is going to overflow, where the overflow may be due to the volume of memory accesses. The status of the FIFO buffer may be indicated by an overflow signal, and a counter to count the occurrences of the FIFO buffer overflow.

Monitoring the workload may include monitoring the overflow count of the FIFO buffer 175 to determine the amount of FIFO buffer capacity being used to handle the incoming memory access commands. If a CPU is accessing memory (e.g., DRAM, SSD, HDD, etc.) faster than the storage 190 can complete the traced memory access data, the FIFO buffer can quickly overflow with the amount of time before overflow depending on the size (e.g., number of entries) of the buffer. Traced memory access data may be lost due to the FIFO buffer overflow.

At block 340, the memory tracer system 150 may determine whether an overflow of the FIFO buffer is acceptable. In a memory tracer system, the memory trace operation stops when the internal FIFO buffer overflows, which then fails to record at least some traced memory access data. In various instances an overflow may be acceptable if the memory trace data is being used for macroscopic and statistical analysis, where statistical analysis may be used to examine and/or determine an application's memory access patterns. The memory tracer system 150 may be applied to computer applications to analyze the memory access behavior.

A FIFO buffer overflow may be unacceptable if the memory trace data is being used for microscopic and command level analysis, where command level analysis may be used to determine the sequence of commands and/or memory response latencies. The CPU also may stall while waiting for the FIFO buffer 175 to free up buffer space after the overflow, thereby slowing up the computer system (e.g., CPU, memory controller, cache memory) speed and performance, and lowering efficiency.

At block 350, if the FIFO buffer overflow and resulting loss of memory trace data is unacceptable, the tracer system controller 170 may adjust operating parameters of the target system 110 and memory to reduce the memory workload and/or increase the memory bandwidth. The loss of the traced memory access data due to the FIFO buffer overflow may be caused by the low write bandwidth of the storage devices 190. The data loss may be prevented by avoiding FIFO buffer overflow through operating mode changes during run time. If the FIFO buffer overflow and data loss is unacceptable, the memory trace data recorded up to the occurrence of the FIFO buffer overflow may be discarded.

In various embodiments, the operation mode may include changes to the collection of refresh commands in the memory trace data and/or adjustments to the DRAM refresh rate. The operation mode may be always enabled or dynamically controlled, where operation mode may include: (A1) expressly setting a DRAM refresh rate according to a workload; (A2) changing a DRAM refresh rate in response to a FIFO buffer overflow; and (A3) changing a DRAM refresh rate in response to changes in a DRAM bandwidth. In various embodiments, the workload may be run in advance to find appropriate refresh rate for the DRAM, where the refresh rate may be set to avoid FIFO buffer overflow. The operation mode may also include: (B1) excluding a refresh command(s) from the collected memory trace data all of the time; (B2) dynamically excluding refresh command(s) from the collected memory trace data in response to a change in the refresh rate; and (B3) dynamically excluding refresh command(s) from the collected memory trace data in response to changes in a FIFO buffer status, where the exclusion of refresh commands from the collected memory trace data may be controlled by the tracer system hardware. The operating mode of the target system 110 may be set at least in part by the memory trace controller 170 to exclude refresh commands from the collected memory trace data.

In one or more embodiments, changes in operating mode may include changes in at least one of: (A1) expressly setting a DRAM refresh rate according to a workload; (A2) changing a DRAM refresh rate in response to a FIFO buffer overflow; or (A3) changing a DRAM refresh rate in response to changes in a DRAM bandwidth; and at least one of (B1) excluding a refresh command(s) from the collected memory trace data all of the time; (B2) dynamically excluding refresh command(s) from the collected memory trace data in response to a change in the refresh rate; or (B3) dynamically excluding refresh command(s) from the collected memory trace data in response to changes in a FIFO buffer status, where the exclusion of refresh commands from the collected data may be controlled by the tracer system hardware.

In various embodiments, the operating mode may include always expressly setting a DRAM refresh rate according to a workload by the memory trace controller 170, as indicated by (A1), and excluding one or more refresh command(s) from the collected memory trace data all of the time, as indicated at (B1, B2).

In various embodiments, the operating mode may include changing a DRAM refresh rate by the dynamic throttling controller module 160 at (A2) in response to a FIFO buffer overflow, and dynamically excluding refresh command(s) from the collected memory trace data in response to a change in the refresh rate at (B1, B2, B3), where the operation mode may be executed by the memory tracer controller 160.

In various embodiments, the operating mode may include changing a DRAM refresh rate in response to changes in a DRAM bandwidth that may be monitored by a bandwidth monitor 140 in target system 110 indicated by (A3), and dynamically excluding refresh command(s) from the collected memory trace data in response to changes in a FIFO buffer status indicated by (B1, B2, B3), where the operation mode is executed by the memory tracer controller 160.

At block 360, if there is no FIFO buffer overflow at block 230 or the FIFO buffer overflow is acceptable at block 240, the collected memory trace data on the memory access of storage 190 may be kept as a disk partition or file. The collected memory trace data kept as a disk partition or file may be analyzed to determine memory access patterns and the sequence of commands and/or memory response latencies to improve target system performance and/or memory access efficiency.

Figure 4:
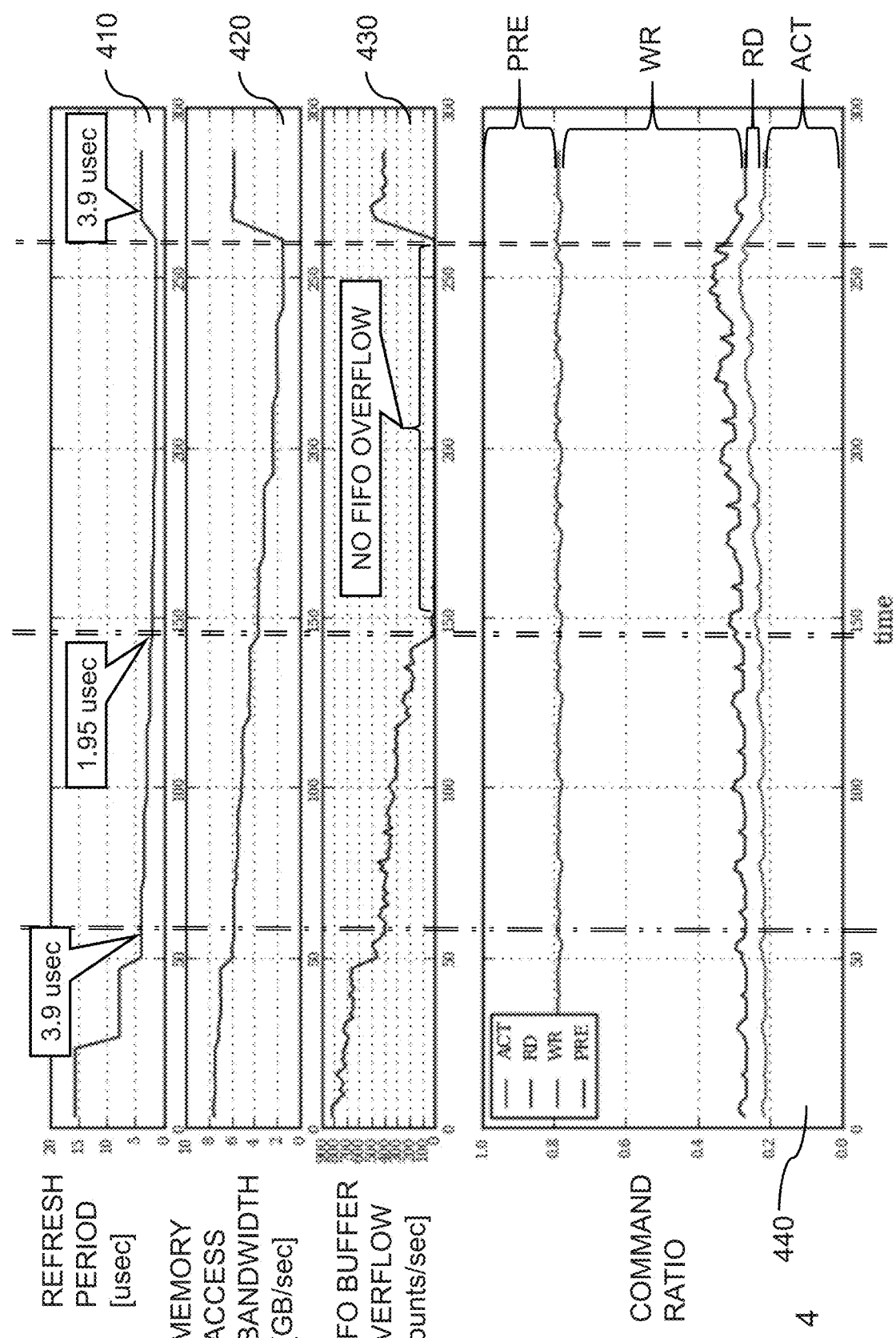
FIG. 4 is a graph of associated test results in accordance with one illustrative embodiment.

FIG. 4 is a set of graphs showing test results for an illustrative embodiment.

The top graph 410 shows setting for a refresh command interval ranging from a long period of about 15.6 usec to a short interval of about 1.35 usec. A default setting was about 3.9 usec. A decrease in the refresh command interval correlates with an increase in the DRAM refresh rate. The DRAM access bandwidth, FIFO overflow rate, and ratio of the command types (ACT/RD/WR/PRE) is observed with changes in the refresh command interval. The graphs indicate the result of excluding refresh commands from traced data as described for operation modes A1 in combination with B1.

The second graph from the top 420 shows changes observed in the DRAM access bandwidth corresponding to changes in the refresh command interval. The DRAM access bandwidth is observed to decrease with decreases in the refresh command interval. The CPU access bandwidth may be precisely be controlled by the refresh command interval.

The third graph from the top 430 shows decreases in the observed number of FIFO buffer overflows as indicated in counts per second. As may be seen, the FIFO overflow ceases to happen when the refresh command interval is shorter than 1.95 us. During the period of time corresponding to that refresh command interval of about 1.95 usec, no FIFO overflow is observed to occur.

The bottom graph 440 shows the command ratio for ACT/RD/WR/PRE indicating that command ratio is not affected much by the change of the refresh command interval. Thus the impact on the workload is minimal in the experiment.

Having described preferred embodiments of a system and method dynamic bandwidth throttling of dram accesses for memory tracing (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of avoiding loss of memory trace data, comprising:
    running a memory trace operation that identifies memory addresses of memory locations of a dynamic random access memory (DRAM) of a target system;
    monitoring a first-in-first-out (FIFO) buffer of a memory tracer system to determine if the FIFO buffer has overflowed due to memory accesses of the dynamic random access memory (DRAM) of the target system by a processor of the target system;
    determining whether an overflow of the FIFO buffer is acceptable using a memory tracer system, including a control module;
    changing an operating mode of the target system, including the processor, during run time based on the acceptability of overflow of the FIFO buffer to avoid FIFO buffer overflow, wherein the operating mode of the target system is changed to adjust a DRAM refresh rate for the dynamic random access memory (DRAM) of the target system based on the determination that the FIFO buffer has overflowed, and setting a memory tracer controller of the memory tracer system to exclude refresh commands from the collected memory trace data in response to changes in the refresh rate; and
    collecting memory trace data on the memory accesses, wherein the memory trace operation fails to record at least some memory trace data in response to an acceptable overflow of the FIFO buffer.

2. The method of claim 1, wherein a dynamic random access memory (DRAM) refresh rate for the dynamic random access memory (DRAM) of the target system is set according to a memory access workload, and the operating mode of the target system is set to exclude refresh commands from the collected memory trace data at all times.

3. The method of claim 1, wherein the operating mode of the target system is changed to adjust a DRAM refresh rate for the dynamic random access memory (DRAM) of the target system in response to changes in a DRAM bandwidth, and setting the target system to exclude refresh commands from the collected memory trace data in response to changes in the FIFO buffer status.

4. The method of claim 1, wherein overflow of the FIFO buffer is determined to be acceptable if the memory trace data is for statistical analysis to determine memory access patterns, and overflow of the FIFO buffer is determined to be unacceptable if the memory trace data is for command level analysis to determine the sequence of commands and/or memory response latencies.

5. The method of claim 1, wherein the operating mode of the target system is set by a memory tracer controller, wherein the memory tracer controller receives a FIFO buffer signal indicating FIFO buffer overflow.

6. The method of claim 5, further comprising determining the memory access workload based on the FIFO buffer usage and/or status from the FIFO buffer signal indicating FIFO buffer overflow, wherein the FIFO buffer usage involves memory access commands, wherein the memory trace operation obtains the type of memory access command from a command line, and the memory address of the memory location being addressed from an address line of a memory bus.

7. A non-transitory computer readable storage medium comprising a computer readable program for avoiding loss of memory trace data, wherein the computer readable program when executed on a computer causes the computer to perform the steps of:
running a memory trace operation that identifies memory addresses of memory locations of a dynamic random access memory (DRAM) of a target system;
monitoring a first-in-first-out (FIFO) buffer to determine if the FIFO buffer has overflowed due to memory accesses of the dynamic random access memory (DRAM) of the target system by a processor of the target system;
determining whether an overflow of the FIFO buffer is acceptable using a memory tracer system, including a control module;
changing an operating mode of the target system, including the processor, during run time based on the acceptability of overflow of the FIFO buffer to avoid FIFO buffer overflow, wherein the operating mode of the target system is changed to adjust a DRAM refresh rate for the dynamic random access memory (DRAM) of the target system based on the determination that the FIFO buffer has overflowed, and setting a memory tracer controller of the memory tracer system to exclude refresh commands from the collected memory trace data in response to changes in the refresh rate; and
collecting memory trace data on the memory access, wherein the memory trace operation fails to record at least some memory trace data in response to an acceptable overflow of the FIFO buffer.

8. The non-transitory computer readable storage medium of claim 7, wherein the computer readable program when executed on a computer causes the computer to: set a DRAM refresh rate for the dynamic random access memory (DRAM) of the target system according to a memory access workload, and set the operating mode of the target system to exclude refresh commands from the collected trace data at all times.

9. The non-transitory computer readable storage medium of claim 7, wherein the computer readable program when executed on a computer causes the computer to: change the operating mode of the target system to adjust a DRAM refresh rate for the dynamic random access memory (DRAM) of the target system in response to changes in a DRAM bandwidth, and set a memory tracer controller of the target system to exclude refresh commands from the collected memory trace data in response to changes in the FIFO buffer status.

10. The non-transitory computer readable storage medium of claim 7, wherein the computer readable program when executed on a computer causes the computer to: set the operating mode of the target system based on a FIFO buffer signal indicating FIFO buffer overflow received by a memory tracer controller.

11. The non-transitory computer readable storage medium of claim 7, wherein the computer readable program when executed on a computer causes the computer to: determine the memory access workload based on the FIFO buffer usage and/or status from the FIFO buffer signal indicating FIFO buffer overflow, wherein the FIFO buffer usage involves memory access commands, wherein the memory trace operation obtains the type of memory access command from a command line, and the memory address of the memory location being addressed from an address line of a memory bus.

12. A target system and memory tracer system configured to avoid loss of memory trace data, comprising:
a central processing unit (CPU) of the target system configured to execute program instructions including memory access instructions;
storage memory and dynamic random access memory (DRAM) configured for memory access by the central processing unit (CPU) of the target system; and
the memory tracer system configured to run a memory trace operation that identifies memory addresses of memory locations of the dynamic random access memory (DRAM) of the target system, monitor memory access by the central processing unit (CPU) of the target system, wherein the memory tracer system includes a first-in-first-out (FIFO) buffer coupled to and in electronic communication with the central processing unit, the DRAM, and the storage memory, and
wherein the memory tracer system is configured to monitor the FIFO buffer to determine if the FIFO buffer has overflowed due to memory access, determine whether an overflow of the FIFO buffer is acceptable, change an operating mode of the target system during run time if overflow of the FIFO buffer is unacceptable to avoid FIFO buffer overflow wherein the operating mode of the target system is changed to adjust a DRAM refresh rate for the dynamic random access memory (DRAM) of the target system based on the determination that the FIFO buffer has overflowed, and configures a memory tracer controller of the memory tracer system to exclude refresh commands from the collected memory trace data in response to changes in the refresh rate, and collect memory trace data on the memory access, wherein a memory trace operation fails to record at least some memory trace data in response to an acceptable overflow of the FIFO buffer.

13. The target system of claim 12, wherein the target system includes a memory controller configured to set a dynamic random access memory (DRAM) refresh rate according to a memory access workload, and the target system is configured to have the operating mode set to exclude refresh commands from the collected memory trace data at all times.

14. The system of claim 12, wherein the target system is configured to have the operating mode able to adjust a DRAM refresh rate for a memory controller in response to the determination that the FIFO buffer has overflowed.

15. The system of claim 12, wherein the operating mode of the target system is changed to adjust a DRAM refresh rate in response to changes in a DRAM bandwidth, and set the target system to exclude refresh commands from the collected memory trace data in response to changes in the FIFO buffer status.

16. The system of claim 12, wherein the operating mode of the target system is set by the memory tracer controller in response to the memory tracer controller receiving a FIFO buffer signal indicating FIFO buffer overflow, wherein the FIFO buffer usage involves memory access commands, and wherein the memory trace operation obtains the type of memory access command from a command line and the memory address of the memory location being addressed from an address line of a memory bus.

17. The system of claim 12, wherein the memory tracer system includes a selector configured to accept or discard a command received from the CPU based on the operation mode of the memory tracer system.

18. The system of claim 17, wherein the memory tracer system includes a dynamic throttling control configured to transmit a selection indicator signal to the selector in response to a FIFO buffer signal received on a FIFO read line.

* * * * *